United States Patent [19]

Alsop, IV

[11] 4,355,391
[45] Oct. 19, 1982

[54] APPARATUS AND METHOD OF ERROR DETECTION AND/OR CORRECTION IN A DATA SET

[75] Inventor: John H. Alsop, IV, Houston, Tex.

[73] Assignee: Texas Instruments Incorporated, Dallas, Tex.

[21] Appl. No.: 136,128

[22] Filed: Mar. 31, 1980

[51] Int. Cl.³ .............................................. G06F 11/10
[52] U.S. Cl. ......................................... 371/37; 371/38
[58] Field of Search ........................ 371/37, 38, 39, 40

[56] References Cited

U.S. PATENT DOCUMENTS

| | | | |
|---|---|---|---|
| 3,413,599 | 11/1968 | Freiman | 371/37 |
| 3,568,148 | 3/1971 | Clark, Jr. | 371/37 |
| 4,030,067 | 7/1977 | Howell et al. | 371/37 |
| 4,077,028 | 2/1978 | Lui et al. | 371/38 |
| 4,168,486 | 9/1979 | Legory | 371/37 |
| 4,201,337 | 5/1980 | Lewis et al. | 371/37 |
| 4,214,228 | 7/1980 | Nara et al. | 371/40 |
| 4,242,752 | 12/1980 | Herkert | 371/37 |

Primary Examiner—Charles E. Atkinson
Attorney, Agent, or Firm—Melvin Sharp; N. Rhys Merrett; Thomas G. Devine

[57] ABSTRACT

Matrix multiplication is used to generate error detection and/or correction binary code bits from a binary input word. A matrix made up of columns and rows of bits set to binary "1"s and "0"s in a pattern conforming to the mathematical expression of a predetermined error detection and/or correction code algorithm is set into a read only memory. The input binary word is 512 bits (64 bytes), one matrix being provided for each of the bytes. The first byte of the 512 bit word is multiplied by its respective matrix providing a ten bit binary code word. Simple odd parity is computed on the first byte and the odd parity bit is appended to the binary code word, which are stored in an accumulator. The next byte is multiplied by its respective matrix to provide another ten bit binary code word, and a simple parity bit is also generated. The second code word and parity bit combination is exclusively ORed in the accumulator with the first binary code word and first parity bit, thereby accumulating the correction and/or detection code. This procedure is continued until all 64 bytes have been handled. The 64 bytes and accompanying eleven error correction and/or detection bits are stored. When recalled from storage, the 64 bytes have the error detection and/or correction bits generated in exactly the same fashion. Means are provided for comparing the new code with the previously computed code. A read-only memory table is provided to locate any erroneous byte to identify the erroneous bit within that byte. Correction circuitry is provided to correct any error within a byte.

29 Claims, 12 Drawing Figures

$P_0$ ROM CODE

| 00 | DA | 10 | AA | 20 | 55 | 30 | 55 |
|---|---|---|---|---|---|---|---|
|  | B5 |  | AA |  | 55 |  | 55 |
|  | 55 |  | AA |  | 55 |  | 55 |
|  | 6A |  | AA |  | 55 |  | 55 |
|  | AA |  | AA |  | 55 |  | 55 |
|  | AA |  | AA |  | 55 |  | 55 |
|  | AA |  | AA |  | 55 |  | 55 |
| 07 | D5 | 17 | AA | 27 | 55 | 37 | 55 |
|  | 55 |  | AA |  | 55 |  | 55 |
|  | 55 |  | AA |  | 55 |  | 55 |
|  | 55 |  | AA |  | 55 |  | 55 |
|  | 55 |  | AA |  | 55 |  | 55 |
|  | 55 |  | AA |  | 55 |  | 55 |
|  | 55 |  | AA |  | 55 |  | 55 |
|  | 55 |  | AB |  | 55 |  | 55 |
| 0F | AA | 1F | 55 | 2F | 55 | 3F | AA |

$P_1$ ROM CODE

| 00 | B6 | 10 | 66 | 20 | CC | 30 | CC |
|---|---|---|---|---|---|---|---|
|  | 6C |  | 66 |  | CC |  | CC |
|  | CC |  | 66 |  | CC |  | CC |
|  | D9 |  | 66 |  | CC |  | CC |
|  | 99 |  | 66 |  | CC |  | CC |
|  | 99 |  | 66 |  | CC |  | CC |
|  | 99 |  | 66 |  | CC |  | CC |
| 07 | B3 | 17 | 66 | 27 | CC | 37 | CC |
|  | 33 |  | 66 |  | CC |  | CC |
|  | 33 |  | 66 |  | CC |  | CC |
|  | 33 |  | 66 |  | CC |  | CC |
|  | 33 |  | 66 |  | CC |  | CC |
|  | 33 |  | 66 |  | CC |  | CC |
|  | 33 |  | 66 |  | CC |  | CC |
|  | 33 |  | 66 |  | CC |  | CC |
| 0F | 66 | 1F | CC | 2F | CC | 3F | CD |

*Fig. 6a*

P₂ ROM CODE

| | | | | | | | |
|---|---|---|---|---|---|---|---|
| 00 | 71 | 10 | 1E | 20 | 3C | 30 | 3C |
| | E3 | | 1E | | 3C | | 3C |
| | C3 | | 1E | | 3C | | 3C |
| | C7 | | 1E | | 3C | | 3C |
| | 87 | | 1E | | 3C | | 3C |
| | 87 | | 1E | | 3C | | 3C |
| | 87 | | 1E | | 3C | | 3C |
| 07 | 8F | 17 | 1E | 27 | 3C | 37 | 3C |
| | 0F | | 1E | | 3C | | 3C |
| | 0F | | 1E | | 3C | | 3C |
| | 0F | | 1E | | 3C | | 3C |
| | 0F | | 1E | | 3C | | 3C |
| | 0F | | 1E | | 3C | | 3C |
| | 0F | | 1E | | 3C | | 3C |
| | 0F | | 1E | | 3C | | 3C |
| 0F | 1E | 1F | 3C | 2F | 3C | 3F | 78 |

P₃ ROM CODE

| | | | | | | | |
|---|---|---|---|---|---|---|---|
| 00 | 0F | 10 | FE | 20 | FC | 30 | FC |
| | E0 | | 01 | | 03 | | 03 |
| | 3F | | FE | | FC | | FC |
| | C0 | | 01 | | 03 | | 03 |
| | 7F | | FE | | FC | | FC |
| | 80 | | 01 | | 03 | | 03 |
| | 7F | | FE | | FC | | FC |
| 07 | 80 | 17 | 01 | 27 | 03 | 37 | 03 |
| | FF | | FE | | FC | | FC |
| | 00 | | 01 | | 03 | | 03 |
| | FF | | FE | | FC | | FC |
| | 00 | | 01 | | 03 | | 03 |
| | FF | | FE | | FC | | FC |
| | 00 | | 01 | | 03 | | 03 |
| | FF | | FE | | FC | | FC |
| 0F | 01 | 1F | 03 | 2F | 03 | 3F | 07 |

*Fig. 6b*

P₄ ROM CODE

| 00 | 00 | 10 | 01 | 20 | 03 | 30 | 03 |
|---|---|---|---|---|---|---|---|
|    | 1F |    | FF |    | FF |    | FF |
|    | FF |    | FE |    | FC |    | FC |
|    | C0 |    | 00 |    | 00 |    | 00 |
|    | 00 |    | 01 |    | 03 |    | 03 |
|    | 7F |    | FF |    | FF |    | FF |
|    | FF |    | FE |    | FC |    | FC |
|    | 80 |    | 00 |    | 00 |    | 00 |
|    | 00 |    | 01 |    | 03 |    | 03 |
|    | FF |    | FF |    | FF |    | FF |
|    | FF |    | FE |    | FC |    | FC |
|    | 00 |    | 00 |    | 00 |    | 00 |
|    | 00 |    | 01 |    | 03 |    | 03 |
|    | FF |    | FF |    | FF |    | FF |
|    | FF |    | FE |    | FC |    | FC |
|    | 00 |    | 00 |    | 00 |    | 00 |

P₅ ROM CODE

| 00 | 00 | 10 | 00 | 20 | 00 | 30 | 00 |
|---|---|---|---|---|---|---|---|
|    | 00 |    | 00 |    | 00 |    | 00 |
|    | 00 |    | 01 |    | 03 |    | 03 |
|    | 3F |    | FF |    | FF |    | FF |
|    | FF |    | FF |    | FF |    | FF |
|    | FF |    | FF |    | FF |    | FF |
|    | FF |    | FE |    | FC |    | FC |
| 07 | 80 | 17 | 00 | 27 | 00 | 37 | 00 |
|    | 00 |    | 00 |    | 00 |    | 00 |
|    | 00 |    | 00 |    | 00 |    | 00 |
|    | 00 |    | 01 |    | 03 |    | 03 |
|    | FF |    | FF |    | FF |    | FF |
|    | FF |    | FF |    | FF |    | FF |
|    | FF |    | FF |    | FF |    | FF |
|    | FF |    | FE |    | FC |    | FC |
| 0F | 00 | 1F | 00 | 2F | 00 | 3F | 00 |

*Fig. 6c*

P$_6$ ROM CODE

| | | | | | | | |
|---|---|---|---|---|---|---|---|
| 00 | 10 | 10 | 00 | 20 | 00 | 30 | 00 |
|  | 00 |  | 00 |  | 00 |  | 00 |
|  | 00 |  | 00 |  | 00 |  | 00 |
|  | 00 |  | 00 |  | 00 |  | 00 |
|  | 00 |  | 00 |  | 00 |  | 00 |
|  | 00 |  | 00 |  | 00 |  | 00 |
|  | 00 |  | 01 |  | 03 |  | 03 |
| 07 | 7F | 17 | FF | 27 | FF | 37 | FF |
|  | FF |  | FF |  | FF |  | FF |
|  | FF |  | FF |  | FF |  | FF |
|  | FF |  | FF |  | FF |  | FF |
|  | FF |  | FF |  | FF |  | FF |
|  | FF |  | FF |  | FF |  | FF |
|  | FF |  | FF |  | FF |  | FF |
|  | FF |  | FE |  | FC |  | FC |
| 0F | 00 | 1F | 00 | 2F | 00 | 3F | 00 |

P$_7$ ROM CODE

| | | | | | | | |
|---|---|---|---|---|---|---|---|
| 00 | 00 | 10 | FF | 20 | 00 | 30 | FF |
|  | 00 |  | FF |  | 00 |  | FF |
|  | 00 |  | FF |  | 00 |  | FF |
|  | 00 |  | FF |  | 00 |  | FF |
|  | 00 |  | FF |  | 00 |  | FF |
|  | 00 |  | FF |  | 00 |  | FF |
|  | 00 |  | FF |  | 00 |  | FF |
| 07 | 00 | 17 | FF | 27 | 00 | 37 | FF |
|  | 00 |  | FF |  | 00 |  | FF |
|  | 00 |  | FF |  | 00 |  | FF |
|  | 00 |  | FF |  | 00 |  | FF |
|  | 00 |  | FF |  | 00 |  | FF |
|  | 00 |  | FF |  | 00 |  | FF |
|  | 00 |  | FF |  | 00 |  | FF |
|  | 00 |  | FE |  | 03 |  | FC |
| 0F | FF | 1F | 00 | 2F | FF | 3F | 00 |

*Fig. 6d*

$P_8$ ROM CODE

| 00 | 00 | 10 | 00 | 20 | FF | 30 | FF |
|----|----|----|----|----|----|----|----|
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FF |
| 07 | 00 | 17 | 00 | 27 | FF | 37 | FF |
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FF |
|    | 00 |    | 00 |    | FF |    | FC |
| 0F | 00 | 1F | 01 | 2F | FF | 3F | F0 |

$P_9$ ROM CODE

| 00 | 00 | 10 | 00 | 20 | 00 | 30 | 00 |
|----|----|----|----|----|----|----|----|
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 00 |
| 07 | 00 | 17 | 00 | 27 | 00 | 37 | 00 |
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 00 |
|    | 00 |    | 00 |    | 00 |    | 03 |
| 0F | 00 | 1F | 00 | 2F | 00 | 3F | FF |

*Fig. 6e*

APPARATUS AND METHOD OF ERROR DETECTION AND/OR CORRECTION IN A DATA SET

BACKGROUND OF THE INVENTION

1. Field of the Invention

This invention relates to error detection and/or correction and particularly to generating an error code by multiplying the input data word by a matrix of "1"s and "0"s conforming to the mathematical expression of a predetermined error detection and/or correction code algorithm.

2. Description of the Prior Art

It has been widely recognized that error detection and/or correction is desirable in situations where an input binary word is operated upon in a manner having a significant probability of inadvertent alteration of at least one of the bits. Accordingly, it is common in systems requiring data transmission/reception or data recording/retrieval to incorporate an error detection and/or correction scheme selected to provide a desired level of detection at an acceptable cost. For example, simple parity check techniques are generally satisfactory in situations where six to eight bits form the word that is to be transmitted or received, stored or read from storage. More sophisticated techniques have found use in systems which involve relatively long binary words or blocks of information. Polynomial or cyclic redundancy code (CRC) techniques have been found to be useful—see U.S. Application Ser. No. 91,681 filed Nov. 5, 1979, now U.S. Pat. No. 4,276,646 issued 6/30/81, entitled "Method and Apparatus for Detecting Errors in a Data Set" to Haggard et al and assigned to the assignee of this invention.

Systematic codes have also been found to be useful in error correction and/or detection. The basis for the code used in this invention is described in detail in the Bell System Technical Journal Volume XXIX, Apr. 1950, No. 2 entitled "Error Detecting and Error Correcting Codes" by R. W. Hamming. This code has been used extensively over the years in connection with relatively short binary words. For example, a sixteen bit input word requires a six bit Hamming code to provide a capability of detecting two errors and correcting one within that sixteen bit word. In the past, the generation of the code has been accomplished through the use of exclusive OR circuits. When, as in the present invention, a large word such as 512 bits is to have a capability of two bit error detection and one bit correction, a code of eleven bits is required. The prior art exclusive OR circuitry would be prohibitively complex and expensive to generate these eleven bits.

In accordance with this invention, matrices made up of "1"s and "0"s conforming to the mathematical expression of the Hamming code are multiplied by each of the 64 bytes making up the 512 bit word.

BRIEF SUMMARY OF THE INVENTION

In this preferred embodiment, a block of 512 bits is written into and read from a solid state mass memory. The type of memory is, of course, irrelevant and could well be a disk, drum or any other memory where large transfers of data are customarily made.

The 512 bits are divided into 64 bytes where each byte is defined as a word that is eight bits in length. The bytes are fed serially into the error detection and/or correction apparatus. The simple odd parity of each byte is determined and each byte is multiplied by a matrix made of columns and rows of bits set to binary "1"s and "0"s in a pattern conforming to the mathematical expression of a predetermined error detection and/or correction code algorithm. In this preferred embodiment, the Hamming code was selected but the invention, of course, is not limited to that code but could be, for example, a CRC code as mentioned above. In addition to the simple parity bit, a ten bit code word must be determined and therefore each matrix is made up of ten rows of bits. The matrices are set in a read-only memory having an address register which is counted sequentially with the incoming bytes so that the proper matrix is multiplied by its associated byte.

The resultant code word from the matrix multipliers and from the simple parity generator is held in a parity accumulator. A code word from each incoming byte is exclusively ORed with the contents in the parity accumulator so that when the sixty-fourth byte has been manipulated, the accumulator holds a corresponding eleven bit code word. For an additional check, a simple parity bit is generated from the eleven bits in the accumulator.

In combination with the novel matrix multiplier code generator is circuitry for determination of error in the 512 bit block. Sometime after storing the block and the code word, they are recalled from the solid state mass memory and new code is generated in exactly the same fashion, using the same circuitry, as described above. Then, through a comparison circuit made up of OR gates, the old code is compared with the new. If they do not correspond and if the overall parity bit is of a particular value, it is known that an error has been made and a correction is possible. The difference between the old and the new code is used as an address in a ROM having an address table. The output from the ROM at that particular address provides the identification of the byte, and in this particular embodiment, the identification of the particular bit in error within the byte. That is, in this preferred embodiment, it was determined that an ability to correct one error bit in the block (and to detect two error bits) provides sufficient accuracy. Having determined through the error address look-up table the location of the error, a correction circuit simply toggles the faulty bit.

It can be seen that, in carrying out this invention, eleven check bits make up a code word capable of detecting and correcting one bit and simply detecting two bits out of a total of 512. In many computers of the prior art, a six bit code word is used to detect and correct one error and to simply detect two errors in sixteen bits. If this particular scheme were used for 512 bits, it can readily be seen that 192 bits would be required for the checking code. This latter scheme would provide more accuracy in that one bit in every sixteen could be corrected but would require a great deal more memory (11 bits vs 182).

Therefore, the principle object of this invention is to provide an error detection and/or correction feature using minimal circuitry to accomplish satisfactory capability.

Another object of the invention then, is to determine a code word by multiplying a matrix of columns and rows of bits set to binary "1"s and "0"s in a pattern conforming to the mathematic expression of a predetermined error detection and/or correction code algorithm by the word to be coded.

These and other objects will be made evident in the detailed description that follows:

BRIEF DESCRIPTION OF THE DRAWINGS

FIGS. 6a–6e are maps, in hexidecimal, of matrices set into the ROM.

DETAILED DESCRIPTION OF THE INVENTION

Figure 1:
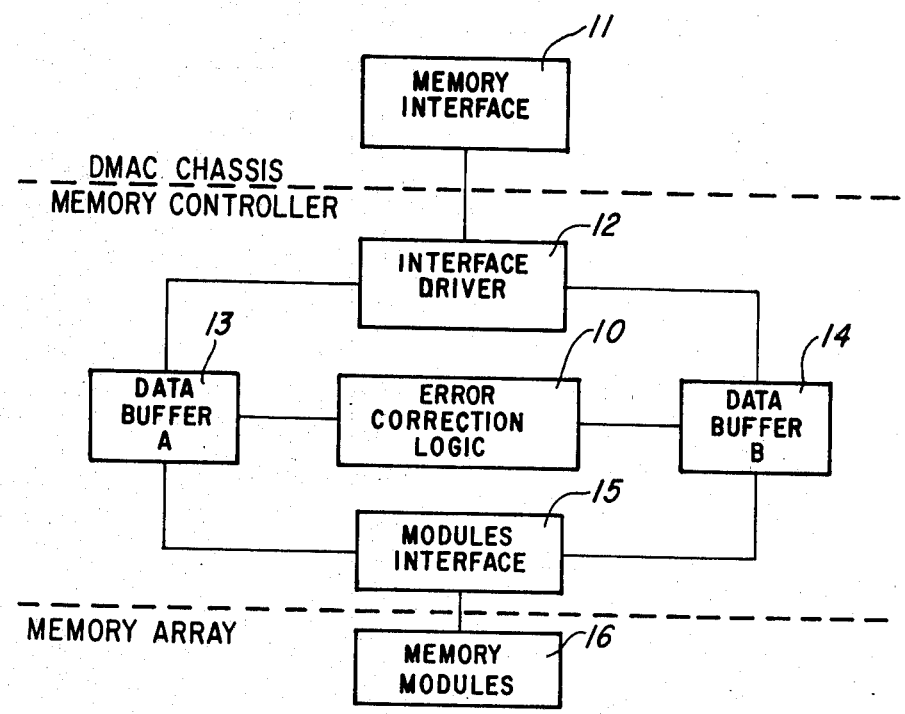
FIG. 1 is a block diagram of a solid state mass memory system which includes the error correction logic of this invention.

Referring now to FIG. 1, error correction logic 10 is shown interconnected to data buffer A13 and data buffer B14 within an overall solid state mass memory system. Memory modules 16 make up the actual memory array communicating with data buffers 13 and 14 through module interface 15. Data buffers 13 and 14 communicate through interface driver 12 with memory interface 11. Not shown is a digital computer which may interconnect with memory interface 11. In this preferred embodiment, the digital computer employed in the system is a Texas Instruments Incorporated type TI980B but, of course, may be any other computer of an appropriate type for the application.

Figure 3A:
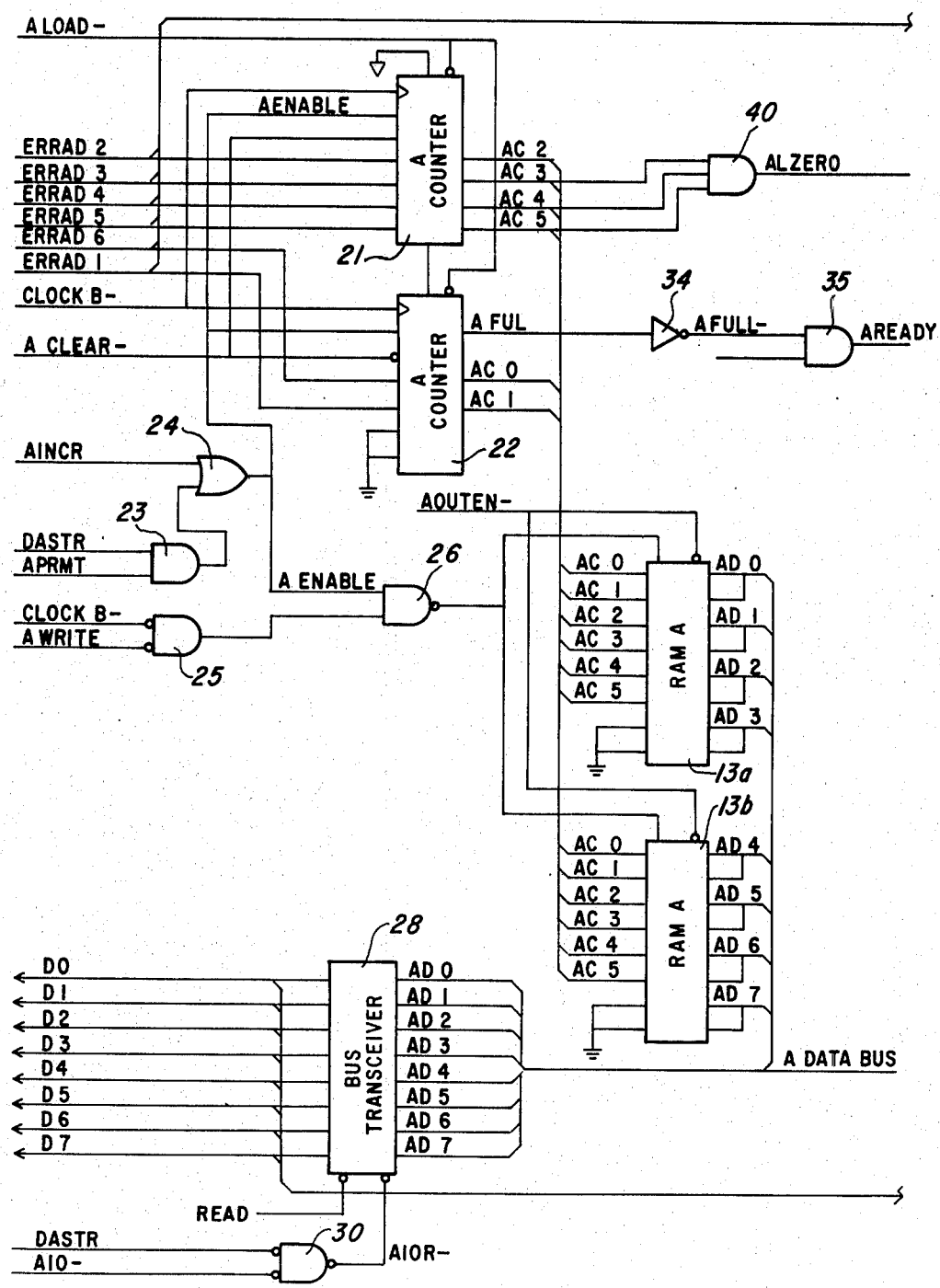
FIGS. 3a and 3b illustrate the A and B buffers and their counters, associated with this invention.
Figure 3B:
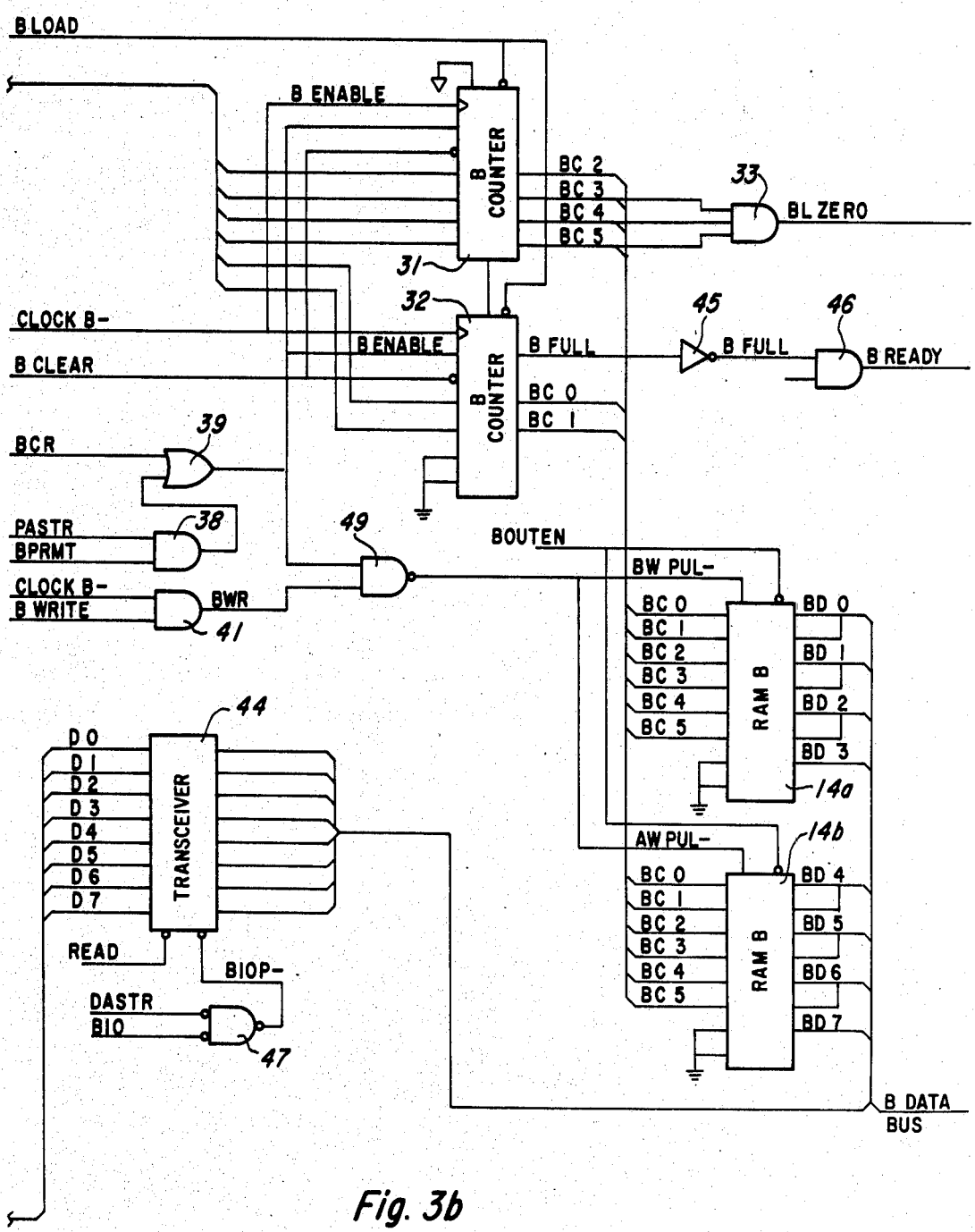

Turning to FIGS. 3a and 3b, byte counters 21 and 22 for the A buffer 13 are shown. These counters are simple synchronous four-bit counters made by Texas Instruments and described in "The TTL Data Book for Design Engineers" Texas Instruments Incorporated Copyright 1976 beginning at page 7-181. The strobe output from section 21 is connected as an input to section 22. Input signals ERRAD0 through ERRAD5 are shown as inputs to counters 21 and 22 and will be described later. Various control inputs are shown. These inputs may be a direct function or may be the inverse of that function. For example, the function may be "A" while the inverse is "A-". With that convention in mind, various of the signals come from the TI980B computer mentioned above and need not be explained further for purposes of disclosing this invention. The ALOAD- signal is applied to the LOAD input of both sections 21 and 22. The clock B-input (derived from the TI980B computer) is applied to the enable input of counters 21 and 22. The ACLEAR- input is connected to the CLEAR inputs of counters 21 and 22. Signals DASTR and APRMT provide inputs to AND gate 23 whose output is one input to OR gate 24, whose other input is provided by the signal AINCR for incrementing the counter. The output of OR gate 24 provides the enable input to counters 21 and 22. The description of B counters 31 and 32 is identical to the description of A counters 21 and 22 except that a BLOAD- signal, a BCLEAR- signal, a BPRMT signal and a BINCR signal replace their A counterparts described with respect to counters 21 and 22.

The output signals AC0, AC1 and AFULL are provided by counter 22 while output signals AC2 through AC5 are provided by counter 21. Signals AC3–AC5 provide inputs to AND gate 40 which provides signal ALZERO. Signal AFULL is inverted through inverter 34 and provides one input to AND gate 35 whose other input is provided by signal ARDY. The output of AND gate 35 is signal AREADY. Signals AC0–AC5 provide address inputs to each of random access memories 13a and 13b which make up A buffer 13. Random access memories 13a and 13b are Texas Instruments type SN74LS208 described beginning at section 4, page 33 of the Texas Instruments Incorporated publication "The Bipolar Microcomputer Components Data Book for Design Engineers" dated December, 1977. The outputs from memories 13a and 13b are AD0 through AD3 and AD4 through AD7 respectively, making up the A data bus.

Signals CLOCKB- and AWRITE are the inputs to NOR gate 25 whose output provides one input to NAND gate 26. The output of OR gate 24 provides the other input to NAND gate 26 whose output is connected to the WRITE input of memories 13a and 13b. NOR gate 41 and NAND gate 49 serve the same function with respect to B buffer memories 14a and 14b, except that signal BWRITE and the output of OR gate 39 are substituted. Signals AOUTEN and BOUTEN are applied to the WRITE inputs of the A buffer memories 13a and 13b and the B buffer memories 14a and 14, respectively.

The outputs of B counter 31 are signals BC2–BC5 which provide inputs to random access memories 14a and 14b. Also, signals BC3–BC5 provide inputs to AND gate 33 whose output is signal BLZERO. Signal BFULL from counter 32 is inverted through inverter 45 and provides one input to AND gate 46 whose other input is provided by the signal BRDY. The output of AND gate 46 provide signal BREADY. Signals BC0 and BC1 from counter 32 provide the other inputs to memories 14a and 14b. The outputs from memories 14a and 14b are signals BD0–BD3 and BD4–BD7 respectively, making up the B data bus.

Bus transceivers 28 and 44 are Texas Instruments type 74LS245 octal bus transceivers described beginning at page 7-349 of the TTL data book. These devices provide transmission in two directions with signals from the memory interface 11 identified as D0 through D7 to both bus transceivers 28 and 44. Signals AD0 through AD7 are shown as output signals on transceiver 28 with signals BD0 through BD7 shown in like manner for transceiver 44. These input and output signals may, of course, be reversed. Signals AD0–AD7 are shown connected to the A DATA bus and signals BD0 through BD7 are shown connected to the B DATA bus. The direction control to each of transceivers 28 and 44 is provided by the control READ signal. Signals DASTR- and AIO- provide inputs to OR gate 30 whose output signal AIOP- provides the enable signal for transceiver 28. Signals DASTR- and BIO- provide inputs to OR gate 47 whose output signal BIOP- provides the enable signal for transceiver 44.

Briefly stated, when the enable signals are provided from either OR gate 24 or OR gate 39, counters 21 and 22 are counted by the clock B- input or counters 31 and 32 are counted by the clock B- input. The count output from either the A counters 21 and 22 or B counters 31 and 32 address either A buffer 13a–13b or B buffer 14a–14b respectively. Information may then be coming in through bus transceiver 28 or bus transceiver 44 or for storage in buffer A or buffer B depending upon which buffer has been activated. Referring to FIG. 1 again, it can be seen that the A buffer 13 and B buffer 14 are identically connected. While the A buffer 13 is, for example, inputting information through the interface driver 12, B buffer 14 is outputting information through module interface 15 to memory module 16. This tandem operation also applies in reverse so that A buffer 13 is receiving information from memory module 16 through module interface 15 while B buffer 14 is transmitting information through interface driver 12 and memory interface 11 to the computer. Substantial increases in speed of operation are obtained by the use of this A and B buffer technique.

Figure 2A:
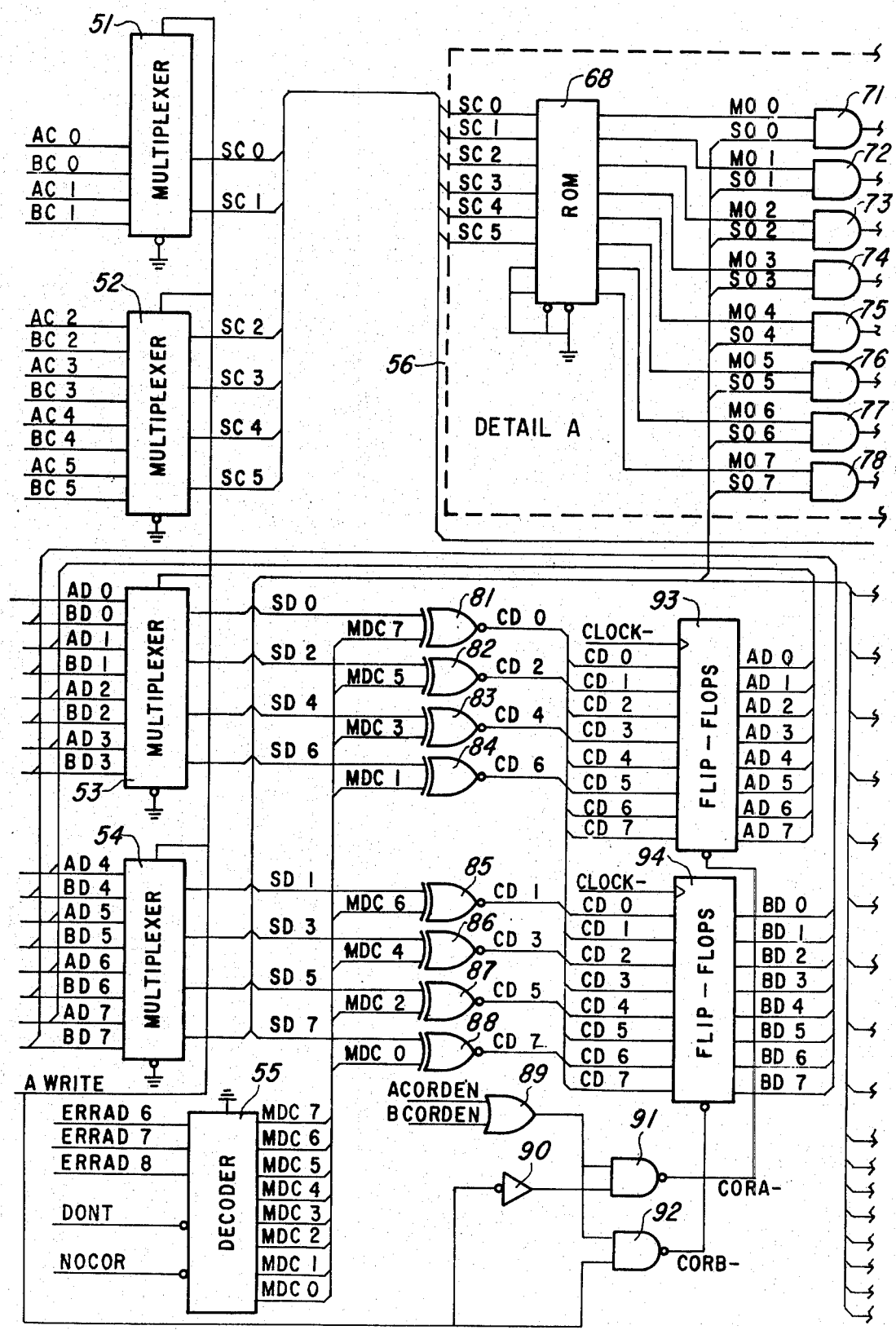
FIGS. 2a and 2b illustrate the matrix multiplier of this invention, together with the error correction circuitry.
Figure 2B:
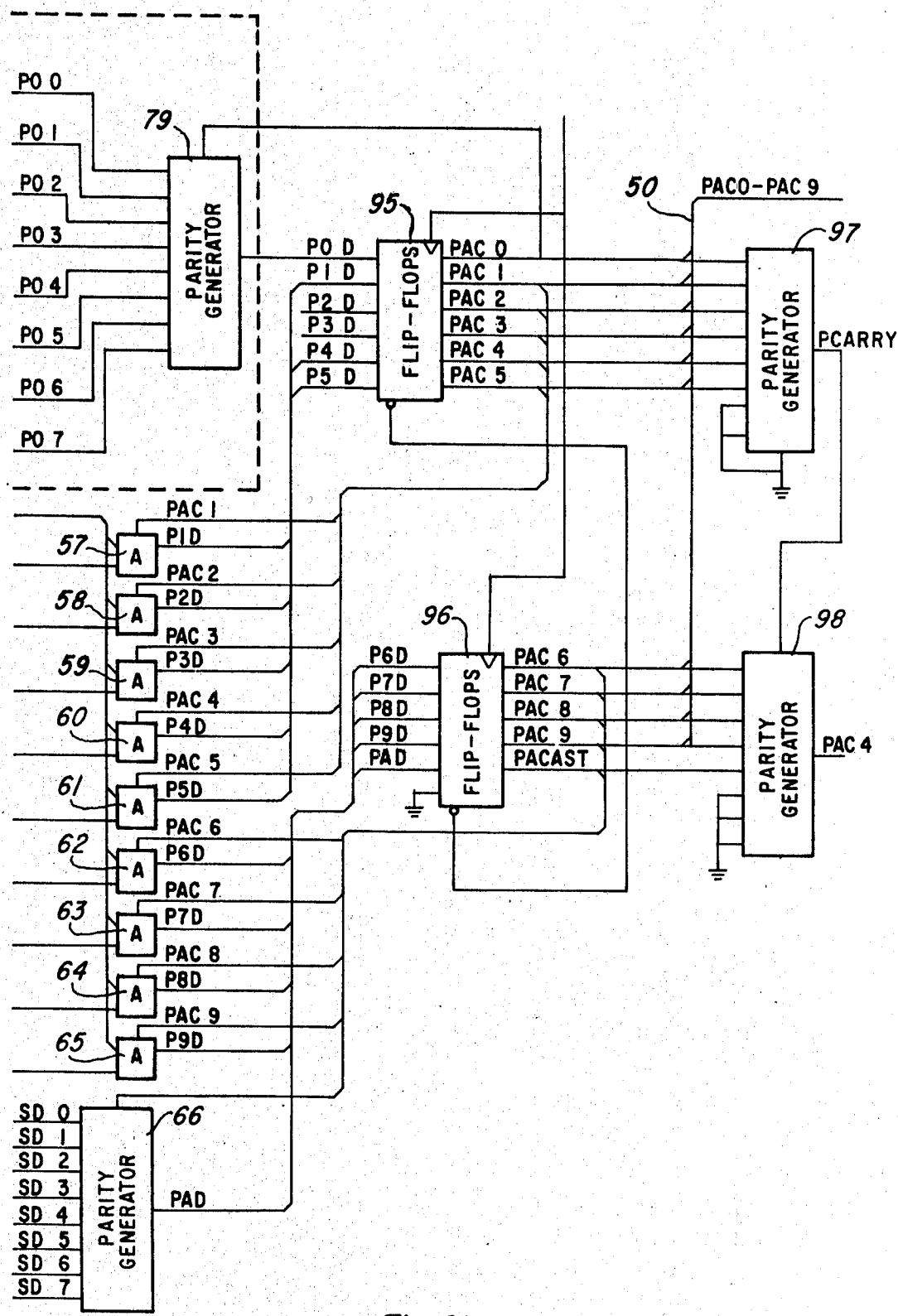

The provision for the A and B buffer technique is made quite evident by the circuitry shown in FIG. 2. There it can be seen that multiplexers 51 and 52, working together, choose between inputs ACZERO through AC5 or inputs BCZERO through BC5. These inputs, it should be noted, are supplied by A counters 21 and 22 and B counters 31 and 32. Multiplexers 51 and 52, as well as multiplexers 53 and 54 are Texas Instruments type 74LS257 quad data selectors/multiplexers described in detail beginning on page 7-372 of the TTL Data Book. The selected outputs SCZERO and SC1 from multiplexer 51 and outputs SC2, SC3, SC4 and SC5 from multiplexer 52 are all applied to the matrix multipliers 56-65. Outputs SC0-SC5 are shown as inputs to ROM 68 which illustrates in detail one matrix multiplier A 56 which is representative of all of the other matrix multipliers 57-65. The read-only memory 68 is a Texas Instruments type 74S471, 256 words by eight bits, "Programmable Read-Only Memory" described in detail beginning at page 4-1 of the bipolar microcomputer components data book. This read-only memory 68 and its counterparts (not shown) in matrix multipliers 57-65 have permanently stored therein the matrices used in the formation of the 11 bit code word (including a simple parity bit). Output signals MO0 through MO7 provide one input to each of AND gates 71-78 respectively. Multiplexers 53 and 54 choose between input signals AD0 through AD7 and BD0 through BD7 with output signals SD0 through SD7 being applied as the other input to each of AND gates 71. The output signals P00 through P07 from AND gates 71-78 are applied as inputs to parity generator 79 which is a Texas Instruments type 74LS280 odd/even parity generator described beginning at page 7-406 of the TTL Data Book. Parity generators 97 and 98 are also Texas Instruments type 74LS280. Parity generator 79 is selected to provide odd parity. By so doing, the matrix multiplication of the input byte by one column of the matrix is completed. This multiplication, with a different matrix for each multiplier, is present in multipliers 57-65. Parity generator 66, also a Texas Instruments type 74SL280 receives the eight bits of the input byte and generates simple odd parity designated PAD which, together with signals P0D-P9D from matrix multipliers 56-65 respectively are applied to flip-flop arrays 95 and 96 which provide output signals PAC0 through PAC9 which are output on bus 50 and also provide inputs to parity generators 97 and 98. Signal PACAST from flip-flop 96 also provides one input to parity generator 98. The odd parity generated by parity generator 97 provides an input to parity generator 98 whose output signal PACA represents the total parity bit.

Signal PAC0 from flip-flop array 95 is applied as an input to parity generator 79. In like manner, signals PAC1 through PAC9 are applied as inputs to the parity generator in each of matrix multipliers 57 through 65. In this manner, the particular bit stored in a flip-flop location provides an input to its respective parity generator, amounting to an input to an exclusive OR circuit. In this manner the code bit is continuously updated through this boolean addition.

Figure 4:
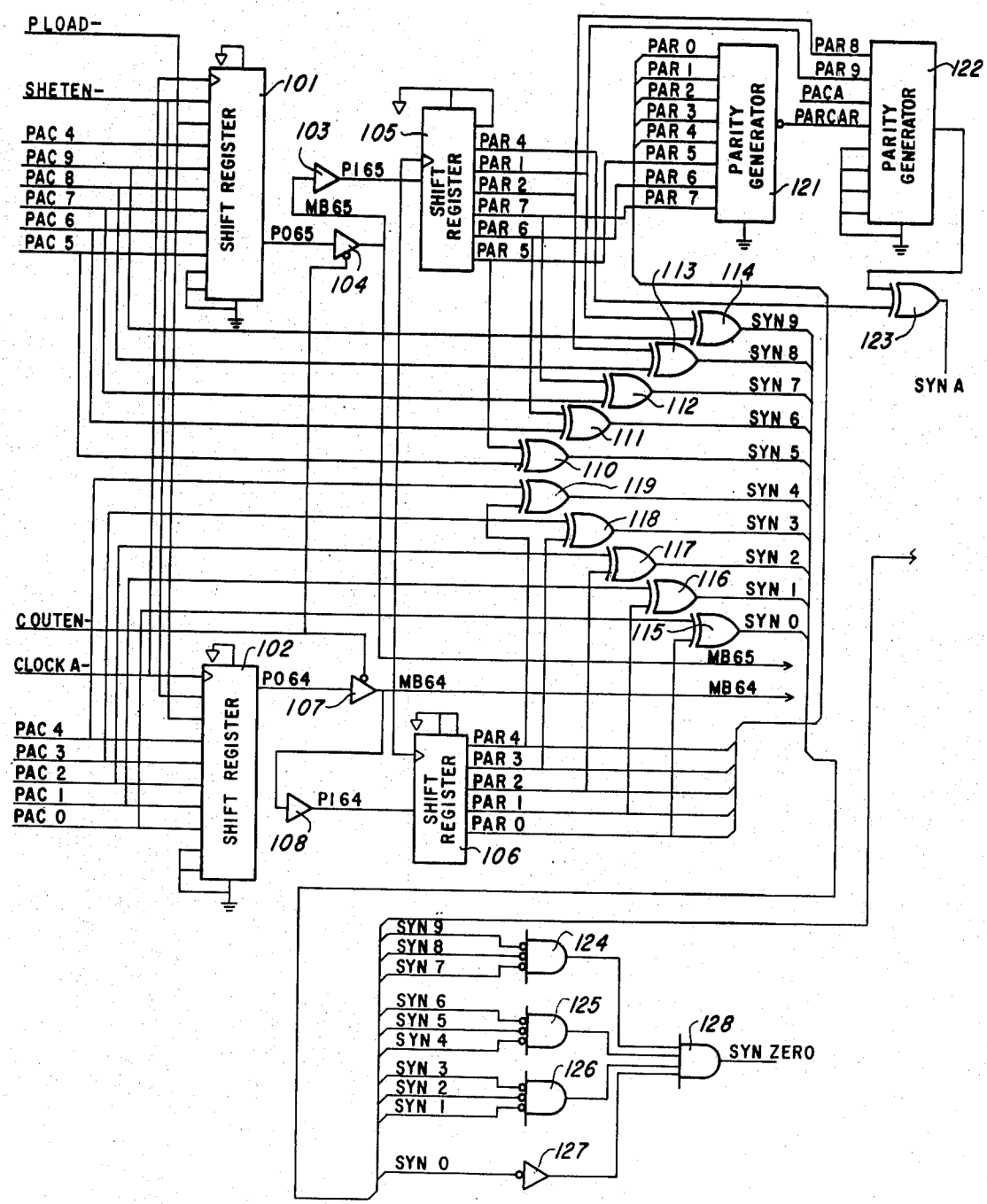
FIG. 4 illustrates the error detection circuitry of this invention.

The error correction circuitry is also set out in FIG. 2a but for the sake of clarity of description, please turn now to FIG. 4 which illustrates the error detection circuitry. Shift registers 101 and 102 which are Texas Instruments type 74LS166 parallel/serial input, serial output shift registers, described beginning at page 7-217 of the TTL Data Book, receive input signals PAC0 through PAC9 from bus 50 and signal PACA from parity generator 98. The signals are shifted serially out of registers 101 and 102 through line drivers 104 and 107 respectively to provide the eleven bit code word output at terminals MB64 and MB65. Line drivers 104 and 107 are activated by signal DOUTEN-. Shift registers 101 and 102 are clocked by signal CLOCKA- from the TI980B computer. A clock inhibit signal SHFTEN- is applied to each of shift registers 101 and 102.

The above description of the shifting out of signals PAC0 through PAC9 and PACA is not associated with error detection but simply illustrates the shifting out of the computed code word bits to the A or B buffer memory. To be considered now is the structure required for error detection, namely the comparison between a newly computed code word from bus 50 and the old code word called in from storage via terminals MB64 and MB65. The output of line driver 104 passes through line driver 103 as the serial input of shift register 105, and in like manner, the output of line driver 107 passes through line driver 108 and is applied as a serial input to shift register 106. Shift registers 105 and 106 are Texas Instruments type 74LS164 parallel output, serial input shift registers described in detail beginning at page 7-206 of the TTL Data Book. The output signals PAR5 through PAR9 from shift register 105 are applied as one input to each of exclusive OR circuits 110 through 114 respectively. In like manner, the output signals PAR0 through PAR3 from shift register 106 are applied as one input to each of exclusive OR gates 115 through 119, respectively. Shift registers 105 and 106 receive signals PAR0 through PAR9 in serial manner from terminals MB65 and MB64 respectively, forming the original code word. The newly computed code word is received as signals PAC0 through PAC9, with signals PAC5 through PAC9 applied as the other input to each of exclusive OR circuits 110 through 114 respectively and signals PAC0 through PAC4 being applied as the other input to each of exclusive OR circuits 115 through 119 respectively. The outputs of exclusive OR circuits 110-119 provide a syndrome word. If the syndrome word is 0, then the new and the original code word must be the same and there is no error. If the syndrome is not 0, then an error is present. The syndrome bits are identified as SYN0 through SYN4 from exclusive OR circuits 115-119 respectively and SYN5 through SYN9 from exclusive OR circuits 110 through 114, respectively. SYN1 through SYN3, SYN4 through SYN6 and SYN7 through SYN9 are applied as inputs to NOR gates 126, 125 and 124, respectively.

Signals PAR0 through PAR7 are applied as parallel inputs to parity generator 121 whose serial output provides one input to parity generator 122. Signals PAR8, PAR9 and PACAST from flip-flop array 96 provide an odd parity output from parity generator 122. The output from parity generator 122 provides one input to exclusive OR circuit 123 whose other input is provided by the overall parity bit PARA. The output signal from exclusive OR gate 123 is identified as SYNA.

SYN0 signal is inverted through inverter 127 and provides one input to AND gate 128. The other inputs to AND gate 128 are provided by the outputs from OR gates 124-126. The output of AND gate 128 provides the signal SYNZERO. If SYNZERO is a 0, then the syndrome word was not equal to 0 and therefore an error exists. Signal SYNA, the output from exclusive OR circuit 123 must then be examined as well. If SYNA is a 1, then a correctable error exists.

Figure 5:
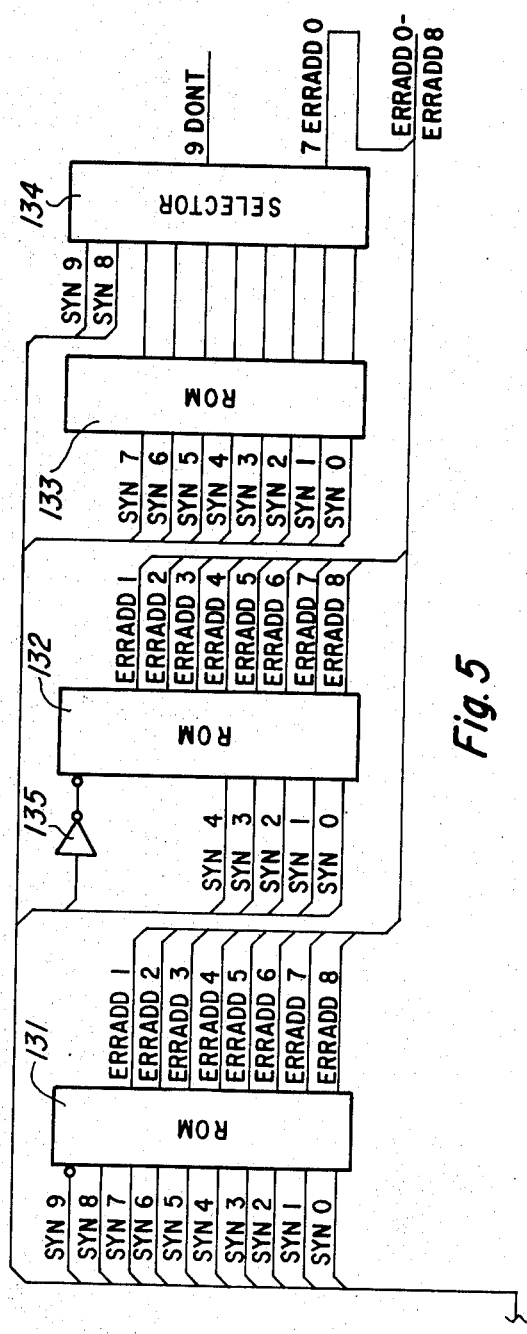
FIG. 5 illustrates the error address look-up table.

FIG. 5 illustrates the error address look-up table in the form of ROMs 131, 132 and 133, and dual 4-1 selector 134. The ROMs are Texas Instruments types 74S472, 74S288 and 74S471, respectively, all described in detail beginning at page 4-1 of the Bipolar Microcomputer Components Data Book. The selector is a Texas instruments type 74S153 dual 4-line to 1-line Data Selectors, described in detail beginning at page 7-165 of the TTL Data Book.

This particular configuration is in lieu of a ten address, nine bit output read only memory (not commercially available). Signals SYN0 through SYN8 are applied as inputs to ROM 131. Signal SYN9 is applied to the select input so that if SYN9 is a "1", then ROM 131 is not selected. ROM 131 is 512×8 in size providing output signals ERRADD1 through ERRADD8. However, more than 512 address inputs are required and ROM 132 which is 32×8 capacity provides the additional memory addressing requirement. It has inputs SYN0 through SYN4 and is controlled by signal SYN9 inverted through inverter 135 so that when SYN9 is a "1", ROM 132 is selected. Note that only signals SYN0 through SYN4 are required to complete the required address capacity. Output signals ERRADD1 through ERRADD8 are available from ROM 132 as from ROM 131.

A nine bit output is required (six bits to identify the byte and three bits to identify the bit). ROM 133 and selector 134 are added to provide this extra bit. Additionally, if the particular bit to be corrected happens to be a parity bit, then it is not corrected and the signal DONT is made available to inhibit changing the parity bit. ROM 133 is of 256×8 bit capacity, but in combination with selector 134, amounts to a 1024×2 bit capacity ROM. That is, signals SYN0 through SYN7 select outputs EAD0 through EAD3 and X0 through X3 as inputs to selector 134. Selector 134 has as select inputs signals SYN8 and SYN9 for selecting one of EAD0 through EAD3 and one of signal X0 through X3, the latter providing the DONT signal and the former providing ERRADD0, completing the desired word. This particular configuration saves on hardware and, therefore, on cost. A large ROM or a pair of ROMS larger than those shown could certainly have been used.

Please refer back to FIG. 2. Multiplexers 53 and 54 take signals AD0 through AD7 and BD0 through BD7 from the A and B data buses respectively. Multiplexers select either the A or the B inputs in the forms of signals SD0 through SD7. These signals are used in the error correction process and represent information taken out of the mass memory and put in either buffer A or buffer B and then retrieved at the address generated by the output of ROMs 131-133 and selector 134. The particular bit that is in error is selected by signals ERRAD6— ERRAD8 which are applied to the input of decoder 55 which also has as an input the signal DONT from selector 134 to suppress changes if the bit is a parity bit. The control signal NOCOR provides a second enable signal with the third enable input being grounded. The three input signals result in a possible one of eight output signals designated MDC0 through MDC7. Signals SD0 and MDC7 are applied to exclusive NOR circuit 81 and, in like manner, signals SD2 and MDC5, SD4 and MDC3, SD6 and MDC1, SD1 and MDC6, SD3 and MDC4, SD5 and MDC2, and SD7 and MDC0, are applied as inputs to exclusive NOR circuits 82 through 88, respectively. Decoder 55 is a Texas Instruments type 74LS138 3 to 8 line decoder described in detail beginning at page 7-134 of the TTL Data Book providing one of outputs MDC0 through MDC7 as a 0. The others are 1s. The selected bit provides either a 1 or a 0 output, depending upon the state to which it is to be corrected. These outputs are provided to flip-flop arrays 93 and 94 in the form of signals CD0 through CD7 being applied to both of those flip-flops, flip-flops 93 receiving the A BUS terms and flip-flop 94 receiving the B BUS terms. Control signal AWRITE controls multiplexers 53 and 54 as well as multiplexers 51 and 52. Control signal AWRITE is also inverted through inverter 90 and applied as one input to NAND gate 91. Control signals ACORDEN and BCORDEN are applied to OR gate 89 whose output provides the other input to NAND gate 91 and provides one input to NAND gate 92 whose other input is the AWRITE signal. The output of NAND gate 91 provides the enable input to flip-flop array 93 and the output of NAND gate 92 provides the enable input to flip-flop array 94. Signals AD0 through AD7 are applied back to the A BUS with the corrected bit includes and signals BD0 through BD7 are applied back to the BBUS with the corrected bit included, depending, of course, on which bit had been defective.

With the detailed description in mind, please study the following preferred mode of operation.

MODE OF OPERATION

Referring to FIG. 3a, input data signals D0 through D7 from memory interface 11 are received by bus transceiver 28 or bus transceiver 44 depending upon whether the output signals are to go to the A buffer 13 or B buffer 14. The buffers operate identically so, for purposes of illustration, assume that the A buffer is to be filled. Then signals AD0 through AD7 from bus transceiver 28 are stored in RAMs 13a and 13b, beginning with address 0 as set out by the A counter 21 and 22. That is, the output of OR gate 24 provides an enable signal for the two counters 21 and 22 and the clock B-signal causes this combination of counters 21 and 22 to count at each clock. Therefore the very first address will be 00, the next address will be 01, the next 02 and so on. When the count reaches 63, indicating that 64 bytes have been received, the output signal AFULL will indicate that A counter 21-22 should be preset to 0 for another operation.

At the same time, signals AD0 through AD7 are applied to multiplexers 53 and 54 of FIG. 2. Also, the output from counters 21 and 22, namely AC0 through AC5 are applied to multiplexers 51 and 52. Signals SC0 through SC5, are applied to the input of ROM 68 (and all of the ROMs associated with multipliers 57 through 65) to read out the particular matrix at the address corresponding to the byte to be processed. Reference should now be made to FIGS. 6a through 6e where the contents of the ROMs are shown in hexidecimal. For example, at address 00 in ROM P0 is hexidecimal value DA; in P1 is hexidecimal B6; in P2 is hexidecimal value 71; in P3 is hexidecimal value 0F and in P4 through P9 is hexidecimal value 00. This pattern is illustrated below in the matrix for address 0.

|     | P9 | P8 | P7 | P6 | P5 | P4 | P3 | P2 | P1 | P0 |
|-----|----|----|----|----|----|----|----|----|----|----|
| D3  | 0  | 0  | 0  | 0  | 0  | 0  | 0  | 0  | 1  | 1  |
| D5  | 0  | 0  | 0  | 0  | 0  | 0  | 0  | 1  | 0  | 1  |
| D6  | 0  | 0  | 0  | 0  | 0  | 0  | 0  | 1  | 1  | 0  |
| D7  | 0  | 0  | 0  | 0  | 0  | 0  | 0  | 1  | 1  | 1  |
| D9  | 0  | 0  | 0  | 0  | 0  | 0  | 1  | 0  | 0  | 1  |
| D10 | 0  | 0  | 0  | 0  | 0  | 0  | 1  | 0  | 1  | 0  |
| D11 | 0  | 0  | 0  | 0  | 0  | 0  | 1  | 0  | 1  | 1  |
| D12 | 0  | 0  | 0  | 0  | 0  | 0  | 1  | 1  | 0  | 0  |

For example, the column under the heading P0 is hexidecimal DA. Note that the matrix is made up of rows of straightforward binary counting except that the parity terms (powers of two) are deleted.

The first byte is defined as being made up of bits D3, D5 D6, D7, D9, D10, D11, D12. This term is multiplied (modulo 2) by each column of the matrix. The equation for the P0 column is $$P0 = 1 \cdot D3 \oplus 1 \cdot D5 \oplus 0 \cdot D6 \oplus 1 \cdot D7 \oplus 1 \cdot D9 \oplus 0 \cdot D10 \\ \oplus 1 \cdot D11 \oplus 0 \cdot D12 \quad (1)$$
$$P0 = D3 \oplus D5 \oplus D7 \oplus D9 \oplus D11$$

The first byte is then multiplied in like manner with the column under P1, then P2 and so on. This process is accomplished through AND gates 71 through 78 and parity generator 79 with respect to multiplier 56. The other multipliers are identical. The resultant sum bit for each of P0 through P9 is stored in flip-flops 95 and 96. The next byte is treated in exactly the same manner but note that parity generator 79 has an additional input, namely PAC0 which enables keeping a running boolean total.

When all 64 bytes have been received and their error detection and/or correction code computed and stored in flip-flops 95 and 96, the procedure is stopped by way of the AFULL output being high from counter 22 causing signal AREADY to go low. Signals PAC0 through PAC9 are output on bus 50 into shift registers 101 and 102 shown in FIG. 4 being serially shifted and output at terminals MB65 for signals PAC5 through PAC9 (and overall parity bit PACA) and MB64 for signals PAC0 through PAC4. This information, together with the 64 data bytes from buffer A are stored in the mass memory. The same procedure is repeated for the B buffer.

When desired, the 64 data bytes and the 11 detection and/or correction bits are brought back from the mass memory and a new 11 bit code word is calculated based on the 64 bytes retrieved from mass memory. A newly computed code word, bits PAC0 through PAC9, is applied as inputs to exclusive OR gates 110 through 119. The original code word is brought back on terminals MB64 and MB65 with signals PAR5 through PAR9 being introduced into shift register 105 and signals PAR0 through PAR3 being introduced into shift register 106. These signals are then output in parallel to the exclusive OR gates 110 through 119 to produce the syndrome output signals SYN0 through SYN9. If the new code word matches the old code word, all of the exclusive OR gate outputs will be 0. On the other hand, if there is no match, there will be one or more 1 outputs. These nine outputs are then used as an input to the error address look-up table of FIG. 5. The contents of the ROMs of FIG. 5 are made up of address information which must not include the addresses of parity positions (powers of 2). Thus address information ERRADD0 through ERRAD8 is brought out from the error address look up table with signals ERRAD0 through ERRAD5 being applied to counters 21 and 22 to retrieve the erring byte from the A buffer memory 13a–13b. These signals AD0 through AD7 are input to multiplexers 53 and 54 of FIG. 2a and then, as signals SD0 through SD7, output to the exclusive NOR circuits 81 through 88. Signals ERRAD6 through ERRAD8 applied to decoder 55 cause one of eight output signals MDC0 through MDC7 to be a 0, applied as an input to one of exclusive NOR circuits 81 through 88, corresponding to the particular bit position needing correcting. That 0 input toggles the output thereby correcting it to one of outputs CD0 through CD7, input to flip-flop array 93. Flip-flip array 94, it should be noted, would be utilized in the event that a B buffer were being handled. Output signals AD0 through AD7 are then available on the A data bus for storage back in the A buffer 13a–13b.

The overall parity bit that was stored is brought back through terminal MB 65 and shift register 105 as signal PARA which provides one input to exclusive OR gate 123. Parity generator 121 and parity generator 122 provide a new total parity bit on the retrieved data and error correction bits, that signal being identified as TOTPAR. Signal TOTPAR provides the other input to exclusive OR gate 123 whose output is signal SYNA. If SYNA is 1, then an odd number of bits are in error. If SYNA is 0, then 0 bits are in error or an even number of bits are in error.

Signal SYNA is considered in connection with signal SYNZERO, the output of AND gate 128. If signals SYN0 through SYN9 all are 0, indicating equality, then signal SYNZERO is 1. If there is not equality, then signal SYNZERO is 0. If SYNZERO is 0, then at least one bit is in error. If 1, then either 0 bits are in error or 4 or more bits are in error. Therefore, if signal SYNA is 1 and signal SYNZERO is 0, there is a correctable error. If both signals are 0, there is an uncorrectable error. If SYNZERO is 1 and SYNA equals 0, then there is no error. Once having determined that a correctable error is present, the above procedure is accomplished.

Those skilled in the art are aware that the particular logic circuitry set out herein need not be slavishly copied to utilize the basic idea as set out herein. For example, a negative logic could be employed where NOR circuits would substitute for OR circuits, and the like. Also, it is clear that the invention is not limited to the Hamming code set out as the preferred example herein. The invention is limited only by the scope of the appended claims.

What is claimed is:

1. Apparatus for generating a binary code word in response to an input binary word, comprising:
   (a) matrix generating means comprising a memory for storing and for supplying a matrix of columns and rows of bits set to binary "1"s and "0"s in a pattern conforming to the mathematical expression of a predetermined error detection and/or correction code algorithm; and
   (b) matrix multiplying means connected to multiply the matrix by the input binary word to yield the binary code word indicative of an error detection and/or correction code.

2. The apparatus of claim 1 wherein the matrix multiplying means comprises:

(b) (i) at least one AND gate for each bit of the input binary word and a corresponding bit of the matrix; and (ii) exclusive OR circuitry for combining the products from the AND gates in exclusive OR logic in conformance with the mathematical expression to provide the binary code word.

3. The apparatus of claim 2 wherein the exclusive OR circuitry comprises a parity generator.

4. The apparatus of claim 3 further comprising unmasked parity generating means for receiving the input binary word, generating at least one parity bit therefrom and appending the bit to the binary code word.

5. The apparatus of claim 4 wherein the memory is a read-only memory.

6. The apparatus of claim 5 wherein the number of bits in each column in the matrix corresponds to the number of bits in the input binary word.

7. Apparatus for generating a binary code word in response to an input binary word that is presented to the apparatus in not less than two sequential sections, comprising:

(a) matrix generating means for supplying a matrix for each of the sequential sections, each matrix being made up of columns and rows of bits set to binary "1"s and "0"s in a pattern conforming to the mathematical expression of a predetermined error detection and/or correction code algorithm;

(b) matrix multiplying means connected to multiply each matrix by the corresponding input binary word section to yield the binary code word indicative of an error detection and/or correction code for the particular section; and (c) accumulator means for accumulating the code output of the matrix multiplying means until all sections have been received and multiplied by their respective matrices.

8. The apparatus of claim 7 wherein the matrix generating means includes an addressable memory in which the matrices are stored and an address register for indexing the memory to read out the matrix that corresponds to the appropriate section.

9. The apparatus of claim 8 wherein the matrix multiplying means comprises:

(b) (i) at least one AND gate for each bit of the input binary word and the corresponding bit of the matrix; and (ii) exclusive OR circuitry for combining the products from the AND gates in exclusive OR logic in conformance with the mathematic expression to provide the binary code word.

10. The apparatus of claim 9 wherein the exclusive OR circuitry comprises a parity generator.

11. The apparatus of claim 10 further comprising unmasked parity generating means for receiving the input binary word section, generating at least one parity bit therefrom and appending the bit to the binary code word.

12. The apparatus of claim 11 wherein the accumulator means is a flip-flop register for temporarily storing the binary code word and the parity bit, each position providing an input to the parity generator to cause accumulation of the binary code word and the parity bit.

13. The apparatus of claim 12 further comprising total parity bit generator means, connected to receive the outputs of the flip-flop register and to generate a parity signal therefrom.

14. Apparatus for detecting and/or correcting errors in a block of sequentially presented input binary words comprising:

(a) matrix generating means for supplying a matrix for each of the input binary words, each matrix being made up of columns and rows of bits set to binary "1"s and "0"s in a pattern conforming to the mathematical expression of a predetermined error detection and/or correction code algorithm;

(b) matrix multiplying means connected to multiply each matrix by the corresponding input binary word to yield a binary code word indicative of an error detection and/or correction code for the particular input binary word;

(c) accumulator means for accumulating the code output of the matrix multiplying means until all the binary words have been received and multiplied by their respective matrices;

(d) means connected to receive and store the block of sequentially presented input binary words;

(e) means for transferring the block of sequentially presented input binary words and the associated binary code words from the accumulator into the apparatus to permit, upon input, sequentially presenting the input binary words to the matrix multiplying means to yield new binary code words;

(f) comparison means for comparing each new binary code word with the corresponding binary code word transferred in;

(g) error locating means, responsive to a signal from the comparison means for locating the erroneous word and the error within the word; and (h) error correcting means for receiving the located erroneous word, masking with the correct word, and toggling the contents where the mask and the erroneous word differ.

15. The apparatus of claim 14 wherein the matrix generating means includes an addressable memory in which the matrices are stored and an address register for indexing the memory to read out the matrix that corresponds to the appropriate word.

16. The apparatus of claim 15 wherein the matrix multiplying means comprises:

(b) (i) at least one AND gate for each bit of the input binary word and the corresponding bit of the matrix; and (ii) exclusive OR circuitry for combining the products from the AND gates in exclusive OR logic in conformance with the mathematic expression to provide the binary code word.

17. The apparatus of claim 16 wherein the exclusive OR circuitry comprises a parity generator.

18. The apparatus of claim 17 further comprising unmasked parity generating means for receiving the input binary word, generating at least one parity bit therefrom and appending the bit to the binary code word.

19. The apparatus of claim 18 wherein the accumulator means is a flip-flop register for temporarily storing the binary code word and the parity bit, each position providing an input to the parity generator to cause accumulation of the binary code word and the parity bit.

20. The apparatus of claim 20 further comprising total parity bit generator means, connected to receive the outputs of the flip-flop register and to generate a parity signal therefrom.

21. The apparatus of claim 20 wherein the means for transferring comprises a buffer memory for temporarily storing the block and contents of the accumulator, and a bus for transmission to and from the buffer memory.

22. The apparatus of claim 21 wherein the comparison means comprises an exclusive OR gate for each bit of the original and the new binary code word.

23. The apparatus of claim 22 wherein the error locating means comprises a read-only memory, addressable by the output of the comparison means.

24. The apparatus of claim 23 wherein the error correcting means comprises an exclusive NOR gate for receiving each bit of the erroneous word and each mask bit, to provide a toggled output at positions where the bits do not match.

25. A method of generating a binary code word in response to an input binary word comprising the steps of:
(a) forming a matrix in a memory, the matrix comprising columns and rows of bits set to binary "1"s and "0"s in a pattern conforming to the mathematical expression of a predetermined error detection and/or correction code algorithms; and
(b) multiplying the matrix by the input binary word to yield the binary code word indicative of an error detection and/or correction code.

26. The method of claim 25 further comprising the steps of:
(c) generating at least one parity bit from the input binary word; and
(d) appending the parity bit to the binary code word.

27. The method of claim 26 further comprising the steps of:
(e) sectioning the input binary word into a plurality of sections; and
(f) accumulating the code output together with the parity bit until all sections have been received.

28. The method of claim 27 further comprising the step of:
(g) transferring the binary word and the code word out to storage.

29. The method of claim 28 further comprising the steps of:
(h) transferring in the binary word and code word from storage;
(i) generating a new code word by repeating steps (a) and (b) on the binary word section transferred in;
(k) comparing the newly generated code word with the code word transferred in;
(l) in the event of no comparison, locating the erroneous section and error within the section; and
(m) correcting the erroneous section by toggling the erroneous bits.

* * * * *